US008466705B1

(12) United States Patent
Howell

(10) Patent No.: US 8,466,705 B1
(45) Date of Patent: Jun. 18, 2013

(54) SYSTEM AND METHOD FOR ANALYZING ELECTRONIC DEVICES HAVING A CAB FOR HOLDING ELECTRONIC DEVICES

(71) Applicant: Robert P. Howell, San Jose, CA (US)

(72) Inventor: Robert P. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 0 days.

(21) Appl. No.: 13/680,390

(22) Filed: Nov. 19, 2012

Related U.S. Application Data

(60) Provisional application No. 61/706,335, filed on Sep. 27, 2012.

(51) Int. Cl.
*G01R 31/20* (2006.01)
*G01R 31/00* (2006.01)

(52) U.S. Cl.
USPC ............. 324/757.01; 324/756.01; 324/756.02

(58) Field of Classification Search
None
See application file for complete search history.

(56) References Cited

U.S. PATENT DOCUMENTS

| 5,517,125 | A | 5/1996 | Posedel et al. |
| 5,596,282 | A * | 1/1997 | Giddings et al. ......... 324/750.22 |
| 6,081,429 | A | 6/2000 | Barrett |
| 6,246,246 | B1 * | 6/2001 | Hembree ................. 324/754.09 |
| 6,320,398 | B1 * | 11/2001 | Ito et al. .................... 324/756.02 |
| 6,354,844 | B1 * | 3/2002 | Coico et al. ...................... 439/66 |
| 7,053,496 | B2 * | 5/2006 | Stone ............................. 257/798 |
| 8,248,091 | B2 | 8/2012 | Cheng et al. |
| 8,277,162 | B2 | 10/2012 | Na et al. |

| 2003/0016025 | A1 | 1/2003 | Martter et al. |
| 2003/0168738 | A1* | 9/2003 | Kabadi et al. ................. 257/738 |
| 2004/0212389 | A1 | 10/2004 | Hamren et al. |
| 2007/0126448 | A1 | 6/2007 | Hubscher et al. |
| 2007/0296419 | A1 | 12/2007 | Aizawa et al. |
| 2008/0169831 | A1 | 7/2008 | Lu |
| 2008/0238460 | A1 | 10/2008 | Kress et al. |
| 2008/0252314 | A1 | 10/2008 | Hopkins et al. |
| 2009/0108859 | A1 | 4/2009 | Teng et al. |

(Continued)

FOREIGN PATENT DOCUMENTS

| JP | 22-22555 | 9/1990 |
| JP | 2012-018176 | 1/2012 |

OTHER PUBLICATIONS

Aldana, F.R. et al., "BGA MPI socket analysis and validation", 2012 International Caribbean Conference on Devices, Circuits and Systems—Mar. 14-17, 2012, IEEE, Piscataway, NJ, Mar. 2012, 6 pages.

(Continued)

*Primary Examiner* — Vinh Nguyen
(74) *Attorney, Agent, or Firm* — Stephen M. De Klerk

(57) ABSTRACT

A system for analyzing electronic devices includes a first cab, an input station, a transport apparatus, an electric machine interface station, and an electric machine interface. The first cab includes a holder having formations for removably receiving a first subset of electronic devices and a communications interface. The input station receives the first cab and the transport apparatus transports the first cab with the first subset of electronic devices from the input station to the electric machine interface station. The electric machine interface is positioned to engage communicatively with the communications interface of the first cab when the first cab is at the electric machine interface station, and is disengageable from the communications interface of the first cab for the first cab to be transportable by the transport apparatus away from the electric machine interface station. Heat conducts to or from the electronic devices while they are being analyzed.

9 Claims, 6 Drawing Sheets

U.S. PATENT DOCUMENTS

| | | |
|---|---|---|
| 2009/0212795 A1 | 8/2009 | Williams |
| 2009/0263217 A1 | 10/2009 | Baccini |
| 2009/0302878 A1 | 12/2009 | Sherry |
| 2010/0097085 A1 | 4/2010 | Takatori |
| 2010/0117669 A1 | 5/2010 | Clarke et al. |
| 2010/0259278 A1 | 10/2010 | Chiang et al. |
| 2011/0084720 A1 | 4/2011 | Wu |
| 2011/0156739 A1 | 6/2011 | Chang et al. |
| 2011/0248738 A1 | 10/2011 | Sze et al. |
| 2012/0049877 A1 | 3/2012 | Rathburn |
| 2012/0062261 A1 | 3/2012 | Nelson et al. |
| 2012/0214261 A1 | 8/2012 | Komoto |
| 2012/0223729 A1 | 9/2012 | Steps et al. |
| 2012/0229158 A1 | 9/2012 | Seo |

OTHER PUBLICATIONS

Gardell, D., "Temperature control during test and burn-in", ITherm 2002. Eighth Intersociety Conference on Thermal and Thermomechanical Phenomena in Electronic Systems (Cat. No. 02CH37258)—May 30-Jun. 1, 2002, IEEE, Piscataway, NJ, 2002, 635-43.

Langston, N. et al., "Optimizing contactors for high-performance test sockets", Advanced Packaging, vol. 13, No. 3, PennWell Publishing, Mar. 2004, 31-34.

McElreath, J.T., "Sockets and heat sinks in high-power burn-in", EE Evaluation Engineering, vol. 46, No. 10, Nelson Publishing Inc., Oct. 2007, 42-45.

Wu, S. et al., "Impedance matching capability of novel socket contactor design using variable open stub for RF packaging testing", Progress in Electromagnetics Research, vol. 113, EMW Publishing, 2011, 67-82.

Yabut, Y. et al., "Device under test (DUT) socket conversion to improve analog load board performance efficiency", IEMT 2006. 31st International Conference on Electronics Manufacturing & Technology, Nov. 8-10, 2006, IEEE, Piscataway, NJ, USA, 2007, 492-495.

\* cited by examiner

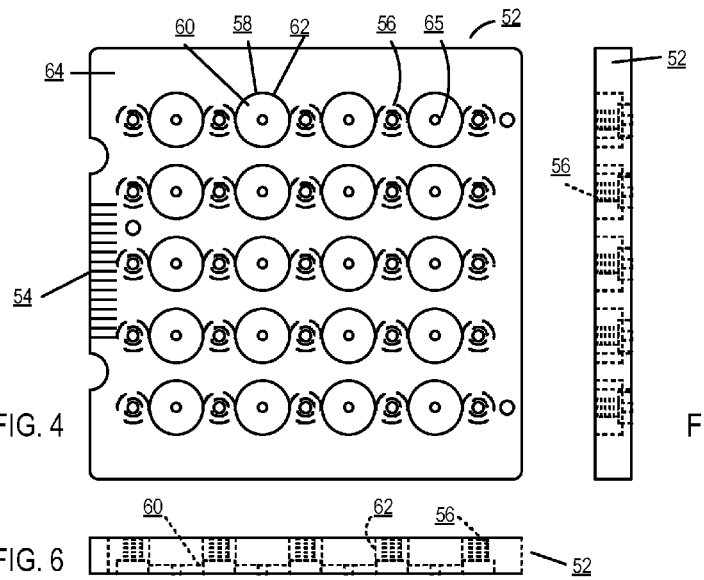
FIG. 4　FIG. 5
FIG. 6
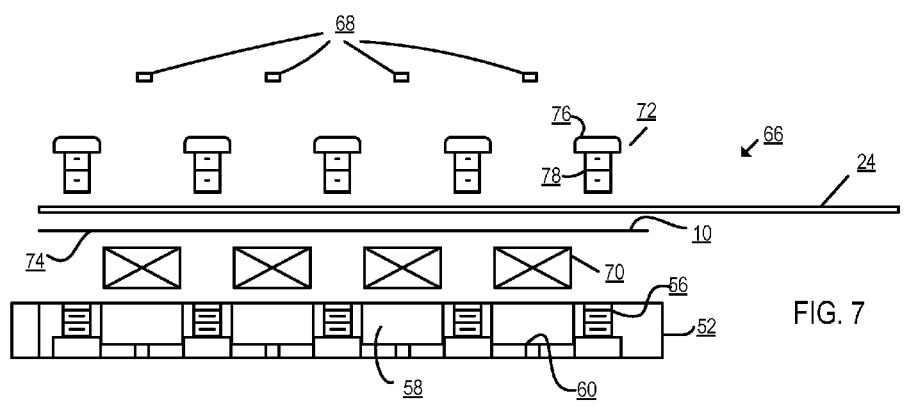
FIG. 7
FIG. 8

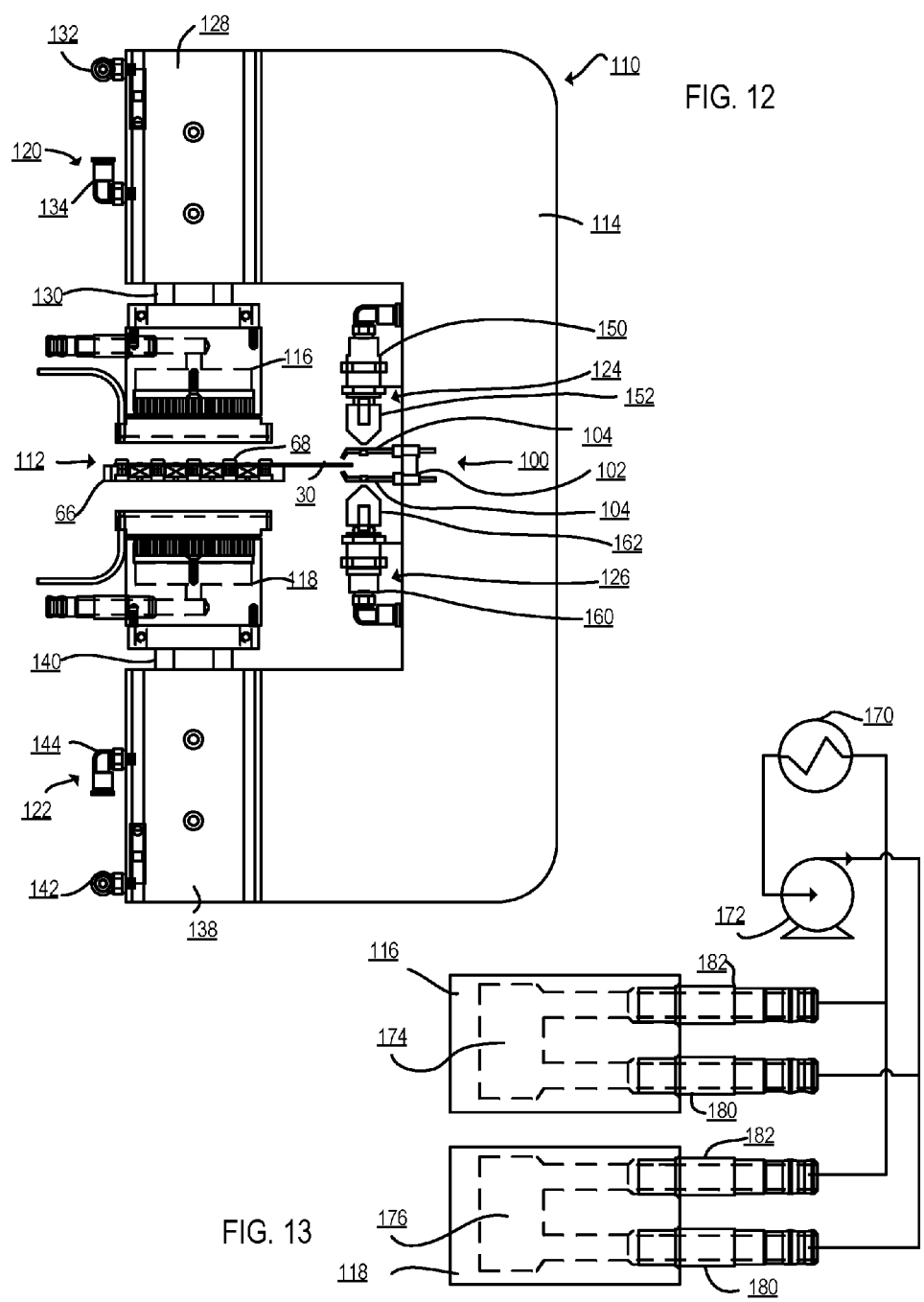

SYSTEM AND METHOD FOR ANALYZING ELECTRONIC DEVICES HAVING A CAB FOR HOLDING ELECTRONIC DEVICES

CROSS-REFERENCE TO RELATED APPLICATIONS

This application claims priority from U.S. Provisional Patent Application No. 61/706,335, filed on Sep. 27, 2012, all of which is incorporated herein by reference in its entirety.

BACKGROUND OF THE INVENTION

1). Field of the Invention

This invention relates generally to a system and method for analyzing electronic devices, including determining a parameter of a measured electronic device.

2). Discussion of Related Art

Before electronic devices are packaged for shipping, it is often required to measure certain parameters of the electronic devices. The parameters may for example be used for programming the electronic devices or may be measured to determine correct functioning of the electronic devices.

A system that is used for analyzing electronic devices often includes a handler and an electric machine. The handler may for example have a bin where electronic devices are loosely deposited, a feed mechanism that feeds the devices one at a time and an electric machine interface station where one electronic device at a time is located against terminals of an electric machine interface. The electric machine is connected to the electric machine interface and can be used for programming the electronic devices, or first measuring frequencies of the electronic devices and then programming the electronic devices based on the frequencies.

The handler is typically suited for handling only electronic devices of a particular profile and size. Every time that an electronic device having a different size and profile has to be handled, the feed mechanism has to be replaced with a feed mechanism that can handle the new electronic device. Terminals of the electric machine interface also have to be replaced with terminals sized for the new electronic device.

Alignment between contacts of the electronic device and the terminals of the electric machine interface is always difficult to achieve. The contacts are typically very small and the matching terminals have to be similarly small. This alignment has to be checked with optical or other means every time that an electronic device is placed on the electric machine interface.

It is often required that the electronic devices be analyzed at temperatures other than room temperature. These temperatures are usually achieved with a thermal device located at the electric machine interface station. Such a thermal device usually heats or cools only one side of the electronic devices thus resulting in a temperature profile from one side to an opposing side of the electronic device. Such a temperature profile makes it difficult to determine accurate measurements for the electronic device as it would perform under conditions where the temperature through the electronic device is uniform, for example under all steady state conditions.

When analyzing an electronic device in such a manner, the temperature of the electronic device also changes very rapidly. Because of requirements for throughput, it is not practical to wait for every device to achieve steady state temperature conditions. A thermocouple is usually used for purposes of measuring temperature in a vicinity of the electronic device, but it is not possible to obtain the exact temperature of the electronic device at any particular moment in time using a thermal couples because of differences in temperature at the thermal couple and at the electronic device.

SUMMARY OF THE INVENTION

The invention provides a system for analyzing electronic devices including a first cab that includes a holder having formations for removably receiving a first subset of electronic devices, each electronic device having a plurality of contacts, a plurality of terminals within in the formations, each to contact a respective one of the contacts of a respective electronic device, and a communications interface connected to the terminals, an input station configured to receive the first cab, a transport apparatus, an electric machine interface station, the transport apparatus transporting the first cab with the first subset of electronic devices from the input station to the electric machine interface station, an electric machine interface positioned to engage communicatively with the communications interface of the first cab when the first cab is at the electric machine interface station, the electric machine interface being disengageable from the communications interface of the first cab and the first cab being transportable by the transport apparatus away from the electric machine interface station, a support structure and a thermal component mounted to the support structure and positioned to conduct heat to the electronic devices when the electronic devices are at the electric machine interface station.

The system may include that the holder may include a support plate having a plurality of support plate securing formations, an interposer having a substrate, wherein the terminals of the first cab are formed on an upper surface of the substrate of the interposer, the interposer being located above the support plate, a printed circuit board having a substrate, a plurality of terminals on the substrate of the printed circuit board, the terminals of the printed circuit board contacting the terminals of the interposer, and a plurality of leads, each lead electrically connecting a respective one of the terminals of the printed circuit board with the communications interface, the communications interface being formed on the substrate of the printed circuit board, the printed circuit board further having a plurality of openings, wherein inside surfaces of a respective opening together with a portion of an upper surface of the interposer jointly form a respective one of the formations for removably receiving the first subset of electronic devices and a plurality of fasteners that secure the printed circuit board to the support plate securing formations of the support plate with the interposer between the support plate and the printed circuit board.

The system may include that the holder may further include a plurality of springs, each spring located between an upper surface of the support plate and a lower surface of the interposer, wherein when pressure is applied on an upper surface of the electronic devices located within the formations, the pressure is transferred through the interposer so as to compress the springs.

The system may include that the communications interface may include a plurality of terminals formed on the substrate of the printed circuit board and the electric machine interface comprises a plurality of terminals, wherein each one of the terminals of the electric machine interface makes contact with a respective one of the terminals of the communications interface.

The system may include that the terminals of the electric machine interface may be a plurality of springs that deform against a spring force when brought into contact with the terminals of the communications interface.

The system may further include an electric machine actuator that is connected to the electric machine interface and having at least first and second actuator components, wherein the second actuator component of the electric machine actuator is movable relative to the first actuator component of the electric machine actuator and the second actuator component of the electric machine actuator is connectable to the electric machine interface to move the electric machine interface into and out of contact with the communications interface.

The system may further include an output station separate from the input station, the transport apparatus transporting the first cab from the electric machine interface station to the output station.

The system may further include a second cab including a holder having formations for removably receiving a second set of electronic devices, each electronic device having a plurality of contacts, a plurality of terminals within the formations to contact a respective one of the contacts and a communications interface connected to the terminals, wherein the input station is configured to receive the second cab, the transport apparatus transports the second cab with the second subset of electronic devices from the input station to the electric machine interface station, the electric machine interface is positioned to engage communicatively with the communications interface of the second cab when the second cab is at the electric machine interface station, the electric machine interface being disengageble from the communications interface of the second cab and the second cab being transportable by the transport apparatus away from the electric machine interface station.

The system may include that the first cab includes a first cab identifier and the second cab may have a second cab identifier that is different from the first cab identifier, further including a cab identifier reader that reads the first and second identifiers and provides the first and second cab identifiers to an electric machine connected to the electric machine interface.

The invention further provides a method of analyzing electronic devices including holding a first subset of electronic devices within respective formations of a first cab, connecting terminals within the formations with respective contacts of the electronic devices, transporting the first cab from an input station to an electric machine interface station, engaging an electric machine interface communicatively with a communications interface of the first cab while the first cab is at the electric machine interface station, communicating signals between an electric machine and a circuit in each one of the electronic devices of the first subset through the electric machine interface and the communications interface of the first cab, conducting heat between a thermal component and the electronic devices while at the electric machine interface station, disengaging the electric machine interface from the communications interface of the first cab and transporting the first cab away from the electric machine interface station.

The holder may further include a support plate having a plurality of support plate securing formations, an interposer having a substrate, wherein the terminals of the first cab are formed on an upper surface of the substrate of the interposer, the interposer being located above the support plate, a printed circuit board having a substrate, a plurality of terminals on the substrate of the printed circuit board, the terminals of the printed circuit board contacting the terminals of the interposer, and a plurality of leads, each one electrically connecting a respective one of the terminals of the printed circuit board with the communications interface, the communications interface being formed on the substrate of the printed circuit board, the printed circuit board further having a plurality of openings, wherein inside surfaces of a respective opening together with a portion of an upper surface of the interposer jointly form a respective one of the formations for removably receiving the first subset of electronic devices and a plurality of fasteners that secure the printed circuit board to the support plate securing formations of the support plate with the interposer between the support plate and the printed circuit board.

The method may include that the holder further comprises a plurality of springs, each spring located between an upper surface of the support plate and a lower surface of the interposer, further comprising applying a pressure on an upper surface of the electronic devices located within the formations, the pressure being transferred through the interposer so as to compress the springs.

The method may include that the communications interface includes a plurality of terminals formed on the substrate of the printed circuit board and the electric machine interface comprises a plurality of terminals, wherein each one of the terminals of the electric machine interface makes contact with a respective one of the terminals of the communications interface.

The method may include that the terminals of the electric machine interface are a plurality of springs, further comprising deforming the terminals of the electric machine interface against a spring force when bringing the terminals of the electric machine interface into contact with the terminals of the communications interface.

The method may include that an electric machine actuator is connected to the electric machine interface and having at least first and second actuator component, further comprising moving the second actuator component of the electric machine actuator relative to the first actuator component of the electric machine actuator to cause the second actuator component of the electric machine actuator to move the electric machine interface into and out of contact with the communications interface.

The method may include transporting the first cab from the electric machine interface station to an output station separate from the input station.

The method may include holding a second subset of electronic devices within respective formations of a second cab, connecting terminals within the formations of the second cab with respective contacts of the electronic devices of the second set, transporting the second cab from the input station to the electric machine interface station, engaging the electric machine interface communicatively with a communications interface of the second cab while the second cab is at the electric machine interface station, communicating signals between the electric machine and a circuit in each one of the electronic devices of the second subset through the electric machine interface and the communications interface of the second cab, disengaging the electric machine interface from the communications interface of the second cab and transporting the second cab away from the electric machine interface station.

The invention also provides a cab including a support plate having a plurality of support plate securing formations, an interposer having a substrate and terminals formed on an upper surface of the substrate of the interposer, the interposer being located above the support plate, a printed circuit board having a substrate, a plurality of terminals on the substrate of the printed circuit board, the terminals of the printed circuit board contacting the terminals of the interposer, and a plurality of leads, each lead electrically connecting a respective one of the terminals of the printed circuit board with the communications interface, the communications interface being formed on the substrate of the printed circuit board, the printed circuit board further having a plurality of openings, wherein inside surfaces of a respective opening together with a portion of an upper surface of the interposer jointly form a respective one of the formations for removably receiving the first subset of electronic devices and a plurality of fasteners that secure the printed circuit board to the support plate securing formations of the support plate with the interposer between the support plate and the printed circuit board.

The cab may further include a plurality of springs, each spring located between an upper surface of the support plate and a lower surface of the interposer, wherein when pressure is applied on an upper surface of the electronic devices located within the formations, the pressure is transferred through the interposer so as to compress the springs.

BRIEF DESCRIPTION OF THE DRAWINGS

The invention is further described by way of example with reference to the accompanying drawings, wherein:

FIG. 4 is a top plan view of a support plate and a first cab identifier forming part of the first cab;

FIG. 5 is a right hand view of the support plate;

FIG. 6 is an end view of the support plate;

FIG. 7 is an exploded side view of the first cab and a first set of electronic devices;

FIG. 8 is a view similar to FIG. 7 after the first cab has been assembled and the first set of electronic devices have been placed on the first cab;

FIG. 12 is a side view of a portion of a system for analyzing electronic devices, including a support structure, thermal and electric components secured to the support structure;

FIG. 13 is a side view illustrating a pump and a temperature modification device for thermal modification of thermal components forming part of the system of FIG. 12;

DETAILED DESCRIPTION OF THE INVENTION

Figure 1:
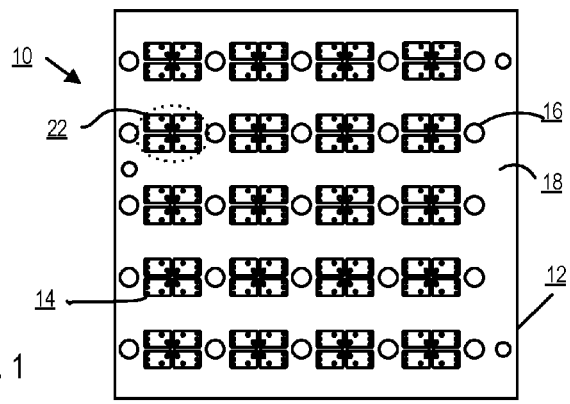
FIG. 1 is a top plan view of an interposer forming part of first cab.

FIG. 1 of the accompanying drawings illustrates an interposer 10 having a substrate 12 and terminals 14. The substrate 12 is made of a thin non-conductive material. Fastener alignment openings 16 are formed through the interposer 10.

The terminals 14 are formed on an upper surface 18 of the substrate 12. The terminals 14 are formed in sets 22 of four terminals 14. In another embodiment there may be six or more of the terminals 14 in different layouts. The sets 22 are arranged in four columns and five rows for a total of 20 of the sets 22. Other layouts may be possible without departing from the scope of the invention. No terminals are formed on a lower surface of the substrate 12 and no conductive vias are formed through the substrate 12.

Figure 2:
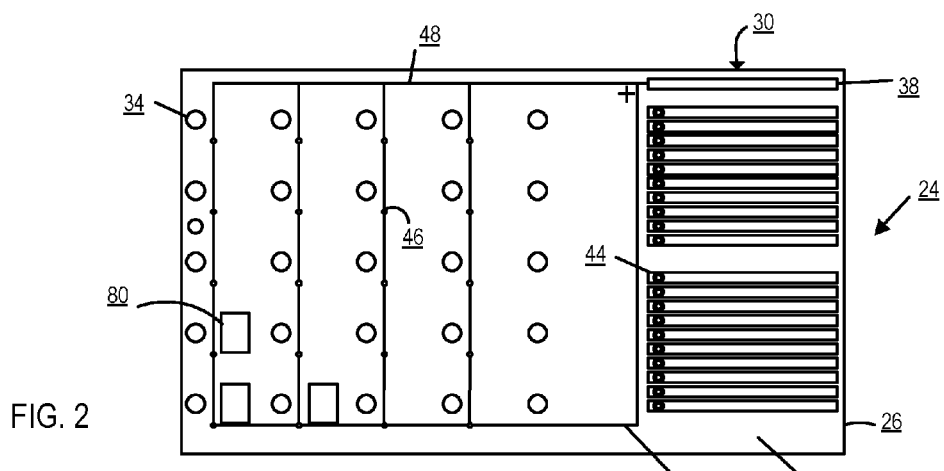
FIG. 2 is a top plan view of a printed circuit board forming part of the first cab.
Figure 3:
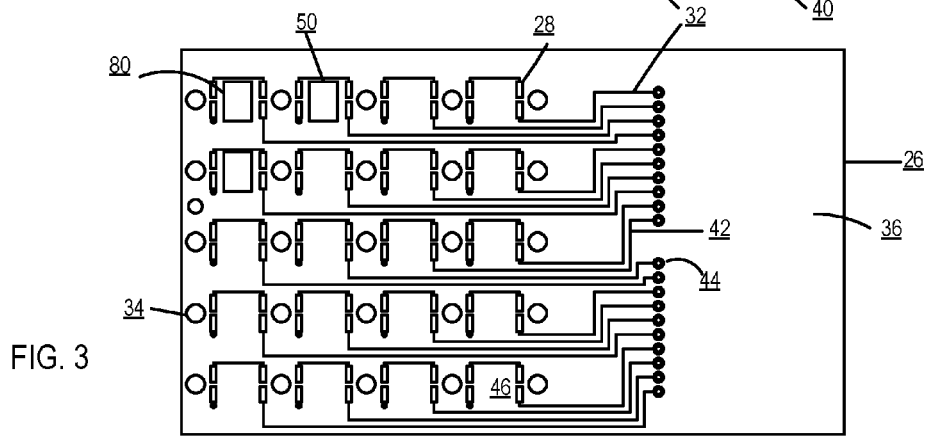
FIG. 3 is a bottom view of the printed circuit board of FIG. 2.

FIGS. 2 and 3 illustrate a printed circuit board 24 that includes a substrate 26, terminals 28, a communications interface 30 and leads 32.

The substrate 26 is made of a non-conductive material. Fastener alignment openings 34 are formed through the substrate 26.

The terminals 28 are formed on a lower surface 36 of the substrate 26. When the printed circuit board 24 is positioned on top of the interposer 10, each one of the terminals 28 makes contact with a portion of a respective one of the terminals 14.

The communications interface 30 includes a plurality of terminals 38 formed on an upper surface 40 of the substrate 26. Each one of the leads 32 is electrically connected between one of the terminals 38 of the communications interface 30 and one or more of the terminals 28. One of the leads 32 has a section 42 on the lower surface 36 and connected to one of the terminals 28, and a via 44 extending through the substrate 26 and connected to one of the terminals 38 on the upper surface 40. Another one of the leads 32 has a via 46 connected directly to one of the terminals 28 on the lower surface 36 and extending through the substrate 26 to the upper surface 40, and a section 48 on the upper surface 40 connecting the via 46 to one of the terminals 38. FIGS. 4, 5 and 6 illustrate a support plate 52 and a first cab identifier 54. The support plate 52 has a plurality of support plate securing formations 56 formed therein. Each support plate securing formation 56 comprises a respective threaded opening. The support plate 52 further has a plurality of recesses 58, each having a respective base 60 and respective side surface 62. Each recess 58 is sized to receive a respective spring within the side surface 62 and with a lower surface of the spring resting on the base 60. The support plate 52 thus has an upper surface 64 and the base 60 forms a lower area of the upper surface 64.

Small openings 65 are formed that extend from the base 60 of each recess 58 out of a lower surface of the support plate. Each opening 65 serves as a light passage through which light from a light-emitting diode transmits to detect whether an electronic device is present or not. The opening 65 also serves to avoid suction by a suction cup of a pick-and-place apparatus when no electronic device is present, in order to avoid lifting of the support plate 52 by the pick-and-place apparatus. In applications where the same pressure is required on both sides of an electronic device, such as when the electronic device is a pressure sensor, the opening 65 allows for airflow to the electronic device and thus equal pressure on both sides of the electronic device.

The first cab identifier 54 is located on an edge of the upper surface 64. The first cab identifier 54 is typically a bar code representing a serial number. The bar code may for example be formed on a sticker that is attached to the upper surface 64.

FIGS. 7 and 8 illustrate a first cab 66 and first subset of electronic devices 68. The first cab 66 includes the support plate 52, a plurality of springs 70, the interposer 10, the printed circuit board 24, and a plurality of fasteners 72.

Each one of the springs 70 is located within a respective one of the recesses 58. A lower surface 74 of the interposer 10 is located on top of the springs 70. The printed circuit board 24 is positioned on top of the interposer 10. Each one of the fasteners 72 is then inserted through a respective one of the fastener alignment openings 16 of the interposer 10 shown in FIG. 1 and a respective one of the fastener alignment openings 34 of the printed circuit board 24 shown in FIGS. 2 and 3. Each fastener 72 has a respective head 76 and a respective shaft 78. The shaft 78 is threaded and is screwed into the thread of one of the support plate securing formations 56. The interposer 10 and the springs 70 are so secured between the printed circuit board 24 and the support plate 52. After the fasteners 72 are secured, the springs 70 may be slightly compressed between the base 60 of the recess 58 and the lower surface 74 of the interposer 10.

A thickness of the printed circuit board 24 compared to a thickness of each of the electronic devices 68 controls how much the interposer 10 is deformed. The electronic devices 68 are slightly thicker than the printed circuit board 24 and the difference between the thicknesses equal the amount that the interposer 10 is deformed when a component with an even lower surface makes contact with the electronic devices 68 and presses down until the even lower surface comes to rest against the printed circuit board 24. The printed circuit board 24 is made slightly thicker for thicker electronic devices 68 to prevent damage to the interposer 10 due to excessive deformation.

Because the terminals 14 are formed directly on the substrate 12 in FIG. 1, the entire cab 66 can be made very thin. By making the cab 66 thin, a high level of thermal control is provided when heating or cooling the cab 66, especially when heating or cooling the cab 66 from opposing sides simultaneously.

The first cab 66 thus includes a holder made up of the components shown in FIGS. 7 and 8 excluding the first subset of electronic devices 68. The first cab 66 further includes the first cab identifier 54 secured to the holder.

Figures 9, 10:
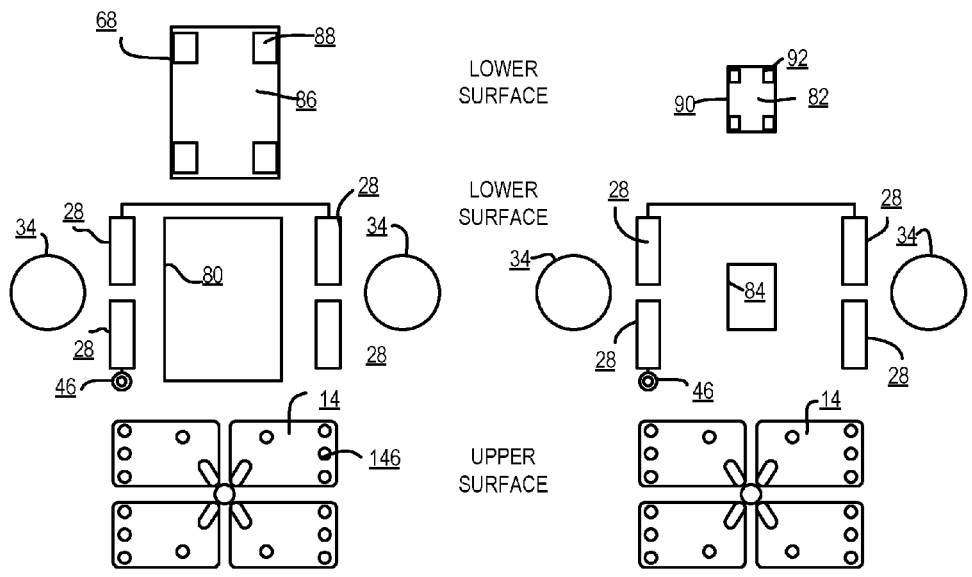
FIG. 9 is a illustrative drawing showing a lower surface of one of the electronic devices, a lower surface of a portion of the printed circuit board, and an upper surface of the interposer.
FIG. 10 is a view similar to FIG. 9 for a smaller electronic device.

Referring again to FIGS. 2 and 3, three openings 80 for electronic devices are shown to be formed through the substrate 26. The first cab 66 shown in FIG. 8 may initially not have the openings 80 formed therein and the openings 80 maybe formed at a later stage and may be shaped and sized to the shape and size of the first subset of electronic devices 68. FIGS. 9 and 10 illustrate one of the electronic devices 68 and another electronic device 82 that is much smaller than the electronic device 68. The opening 80 cut into the substrate 26 in FIG. 3 is slightly larger than the electronic device 68. Should it however be desired that the electronic device 82 be accommodated within the substrate 26 of FIGS. 2 and 3, then another opening 84 may be cut within the substrate 26 of FIGS. 2 and 3 instead of the much larger opening 80. In both FIGS. 9 and 10, the terminals 28 make contact with a respective one of the terminals 14. In FIG. 9, the electronic device 68 has a body 86 and contacts 88 formed on the body 86, and the body 86 fits within the formation/opening 80 so that the contacts 88 make contact with a respective one of the terminals 14. Each one of the terminals 14 is thus in contact with a respective one of the contacts 88 and respective one of the terminals 28. The respective contact 88 is thus connected through the respective terminal 14 to the respective terminal 28.

In FIG. 10, the electronic device 82 has a body 90 and contacts 92, wherein the body 90 fits within the opening 84 and each one of the contacts 92 makes contact with a respective one of the terminals 14. A respective contact 92 is thus connected through a respective terminal 14 to a respective terminal 28.

In both FIGS. 9 and 10, an upper surface of the interposer 10 in FIG. 1 together with a side surface of the respective opening 80 or 84 forms a respective formation for the respective electronic device 68 or 82. The same first cab 66 shown in FIG. 8 can thus be used for receiving either a set of electronic devices such as the electronic device 68 or a set of electronic devices such as the electronic device 82.

The formation 80 provides for very tight alignment of the electronic device 68 relative to the terminals 14. Tight alignment is achieved even though the contacts 88 may be very small. It can be noted at this stage that there will be no requirement for further alignment of the contacts 88 with the terminals 14 at a later stage for example when the first cab 66 reaches an electric machine interface station. The only requirement would be for relatively good alignment between the terminals 38 of the communications interface 30 shown in FIG. 2 and corresponding terminals of an electric machine interface. Very precise alignment between the electronic device 68 and the terminals 14 is thus achieved in advance by the precision cutting of the openings 80.

Figure 11:
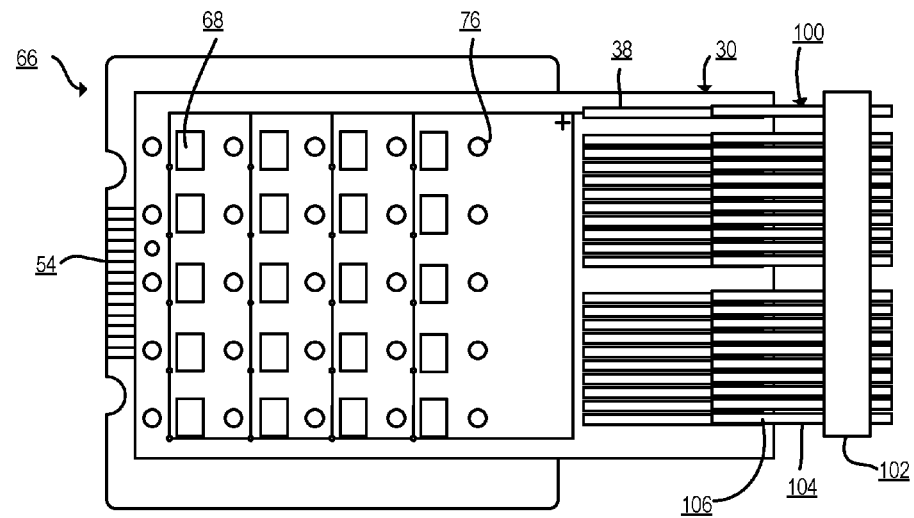
FIG. 11 is a top plan view of the first cab and an electric machine interface.

FIG. 11 illustrates the first cab 66 holding the first subset of electronic devices 68, an electric machine interface 100 and a support structure 102.

The electric machine interface 100 includes a plurality of terminals 104 that are held by the support structure 102. Each one of the terminals 104 is in the form of cantilever spring. The first cab 66 is positioned so that each terminal 38 of the communications interface 30 is directly below an end of a respective one of the terminals 104 of the electric machine interface 100. When a force is applied to an intermediate location 106 of each one of the terminals 104, the respective terminal 104 bends towards a respective one of the terminals 38 so that an end of the terminal 104 contacts the respective terminal 38. When force is relieved from the intermediate location 106, the contact between the terminal 104 and the terminal 38 is broken.

FIG. 12 illustrates components of a system 110 for analyzing electronic devices at and around an electric machine interface station 112, including the first cab 66 holding the first subset of electronic devices 68, located at the electric machine interface station 112, a support structure 114, first and second thermal components 116 and 118 respectively located above and below the first cab 66, first and second thermal device actuators 120 and 122, and first and second electric machine actuators 124 and 126.

The first thermal device actuator 120 includes a cylinder 128 and a piston 130. The cylinder 128 has inlet and outlet openings 132 and 134. The piston 130 moves out of the cylinder 128 when fluid flows into the inlet opening 132 and out of the outlet opening 134 and in an opposite direction when the flow of fluid is reversed. The cylinder 128 is secured to the support structure 114 and the first thermal component 116 is secured to the piston 130. The first thermal component 116 is thus moved by the first thermal device actuator 120 towards or away from the first set of electronic devices 68.

Similarly, the second thermal device actuator 122 includes a cylinder 138 and a piston 140. The cylinder 138 has inlet and outlet openings 142 and 144, respectively. The cylinder 138 is mounted to the support structure 114 and the second thermal component 118 is mounted to the piston 140. The second thermal device actuator 122 moves the second thermal component 118 towards or away from a lower surface of the first cab 66.

When both the first and second thermal components 116 and 118 are moved towards the first subset of electronic devices 68 and the first cab 66, they simultaneously contact upper surfaces of the first subset of electronic devices 68 and the lower surface of the first cab 66. Further pressure by the first and second thermal components 116 and 118 increases the pressure of the contacts 88 against the terminals 14 shown in FIG. 9. Slight deformation of the interposer 10 shown in FIG. 7 is allowed for because of the materials and thickness of the interposer 10 and resiliency provided by the springs 70 shown in FIG. 7. As further shown in FIG. 9, each terminal 14 has a number of bumps 146 formed thereon. Each bump 146 is in the form of a diamond particle that is coated with a metal. The metal coating the respective particle is electrically connected to the rest of the terminal 14. The bumps 146 form pressure points that make good contact with the contacts 88 due to microscopic deformation of the contacts 88 under pressure. The diamond particles are stills sufficiently strong to be able to be used for contacting multiple sets of electronic devices. Although diamond particles are preferred, it may be possible to have bumps of a different material such as gold bumps.

As further illustrated in FIG. 12, the electric machine interface 100 has terminals 104 on opposing sides of the communications interface 30. The support structure 102 of the electric machine interface 100 is secured to the support structure 114. The terminals 104 above the communications interface 30 can bend down towards the communications interface 30 and the terminals 104 below the communications interface 30 can bend upwards towards the communications interface 30. In the example described, the terminals 38 are only formed on an upper surface of the printed circuit board 24 shown in FIG. 2. In another embodiment, terminals can also be formed on the lower surface 36 shown in FIG. 3 and be electrically connected through leads to electronic devices.

The first electric machine actuator 124 includes first and second electric machine actuator components 150 and 152. The first electric machine actuator component 150 is secured to the support structure 114. The second electric machine actuator component 152 is mounted for movement relative to the first electric machine actuator component 150. The second electric machine actuator component 152 may for example be movable relative to the first electric machine actuator component 150 by a solenoid. The second electric machine actuator component 152 moves down into contact with the terminals 104 above the communications interface 30 and bends the terminals 104 towards the communications interface 30 so that the terminals 104 make contact with the terminals 38 of the communications interface 30 shown in FIG. 11. Similarly, the second electric machine actuator 126 includes first and second electric machine actuator components 160 and 162, wherein the first electric machine actuator machine component 160 is mounted to the support structure 114 and the second electric machine actuator component 162 is mounted for movement relative to the first electric machine actuator component 160. The second electric machine actuator component 162 contacts and bends the terminals 104 below the communications interface 30 into contact with the lower surface 36 of the printed circuit board 24 shown in FIG. 3. The terminals 104 above and below the communications interface 30 then clamp the printed circuit board 24 shown in FIG. 3 in a stable position between the terminals 104.

FIG. 13 further illustrates a temperature modification device 170 and a pump 172. The first and second thermal components 116 and 118 have thermal passages 174 and 176 formed therethrough. Each thermal passage 174 has a respective inlet 180 and a respective outlet 182. The temperature modification device 170 and the pump 172 are located in series with the thermal passage 174 of the first thermal component 116. The temperature modification device 170 and the pump 172 are also located in series with the thermal passage 176 of the second thermal component 118. A thermal fluid is pumped by the pump 172 through the thermal passages 176 and the temperature modification device 170. The temperature modification device 170 may for example include a heater that heats the fluid or a cooler that cools the fluid. If the fluid is heated, the heat convects from the fluid to the first and second thermal components 116 and 118. The heat then conducts through the material of the first and second thermal components 116 and 118. Heat then conducts from the first thermal component 116 to the electronic devices 68 and conducts from the second thermal component 118 through the cab 66 to the electronic devices 68. If the fluid is cooled by the temperature modification device 170 then heat transfers from the first and second thermal components 116 and 118 to the fluid.

Because the first and second thermal components 116 and 118 are located above and below the first cab 66 and the first subset of electronic devices 68, the entire first cab 66 and the first subset of electronic devices 68 can be brought to practically the same temperature with very little thermal gradient. By contrast, if only the first thermal component 116 would be used without the second thermal component 118 then a temperature gradient would exist from top-to-bottom through the first subset of electronic devices 68 and the first cab 66.

Figure 14:
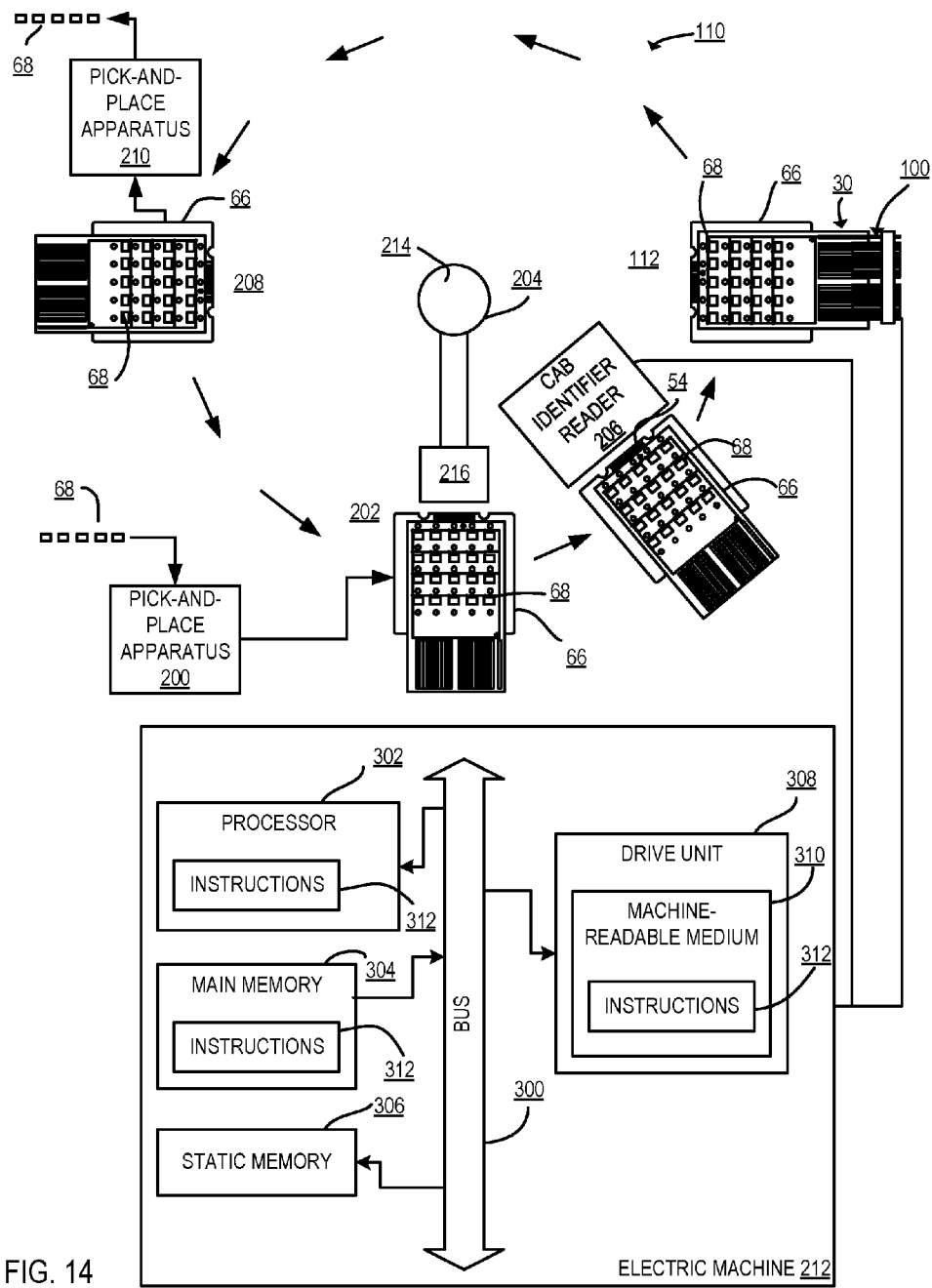
FIG. 14 shows the system wherein structural components of the system are shown in top plan view and a block diagram is shown of an electric machine forming part of the system.

FIG. 14 illustrates further components of the system 110, including a pick-and-place apparatus 200, an input station 202, a transport apparatus 204, a cab identifier reader 206, an output station 208, a pick-and-place apparatus 210 and an electric machine 212.

The transport apparatus 204 is a rotary handler having a rotation axis 214 and a holder 216. The holder 216 is rotated about the axis 214. The first cab 66 can be held by the holder 216 and be rotated about the axis 214.

The holder 216 first locates the first cab 66 in the input station 202. The first subset of electronic devices 68 are fed into the pick-and-place apparatus 200 and are then placed by the pick-and-place apparatus 200 onto the first cab 66. The first subset of electronic devices 68 are loosely held within the first cab 66; should the first cab 66 for example be turned over, the first subset of electronic devices 68 would fall out of the first cab 66.

The holder 216 then transports the first cab 66 with the first set of electronic devices 68 to the cab identifier reader 206. The cab identifier reader 206 is typically a bar code scanner that reads the first cab identifier 54 of the first cab 66. Should multiple cabs be used, the cab identifier reader 206 can identify which cab is being used.

The holder 216 then transports the first cab 66 to the electric machine interface station 112. As previously described, the communications interface 30 is connected to the electric machine interface 100. The electric machine interface 100 is then disconnected from the communications interface 30, whereafter the holder 216 transports the first cab 66 to the output station 208. While at the output station, the pick-and-place apparatus 210 lifts the first subset of electronic devices 68 from the first cab 66, and moves them to a location for further processing. The holder 216 then transports the first cab 66 back to the input station 202 where the pick-and-place apparatus 200 loads a second subset of electronic devices on to the first cab 66. In an alternate embodiment, a second cab may be moved by the holder 216 or another holder connected to the axis 214 such that the first cab 66 and the second cab are at different stations at any particular point in time. The first cab 66 can carry a first subset of electronic devices 68 and the second cab can carry a second subset of electronic devices. After the electronic devices are removed from the first cab 66 at the output station 208, a third subset of electronic devices can be located on the first cab 66. Similarly, when the second subset of electronic devices is removed from the second cab at the output station 208, a fourth subset of electronic devices can be located on the second cab at the input station 202.

The electric machine interface 100 and the cab identifier reader 206 are both connected to the electric machine 212 for purposes of identifying a respective cab and for measuring the respective set of electronic devices held by the respective cab. Each cab has a set of reference electronic devices that are permanently affixed thereto and by identifying the respective cab, the electric machine 212 also identifies a respective reference profile of the respective reference electronic devices.

The electric machine 212 includes a bus 300, a processor 302, a main memory 304, static memory 306, and a drive unit 308 that are all connected to the bus 300. The drive unit 308 has a machine-readable medium 310. The set of instructions 312 is located on the machine-readable medium 310 and is distributed to the main memory 304 and to the processor 302. The set of instructions 312 is executable by the processor 302 to carry out a method according to the invention. The machine-readable medium 310, main memory 304 and the static memory 306 are non-transitory.

Figure 15:
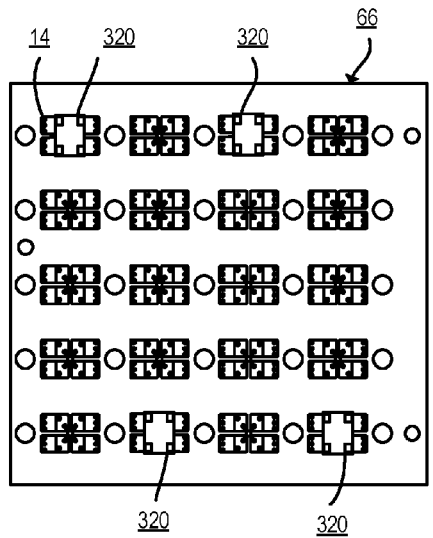
FIG. 15 is a top plan view of only the interposer of the first cab and four reference electronic devices placed on and permanently affixed to terminals of the first cab.

FIG. 15 illustrates the first cab 66 with four reference electronic devices 320 thereon but before the first subset of electronic devices 68 that have to be measured have been placed thereon. The reference electronic devices 320 are permanently affixed to the terminals 14 while some of the formations are open to receive measured electronic devices that can make contact with the terminals in the open formations. The first cab 66 is then located in an environment where the temperature remains constant for a period of time so that the entire first cab 66 achieves steady state temperature. The temperature is then constantly changed while measuring a frequency from each one of the reference electronic devices 320 at each steady state temperature.

Figure 16:
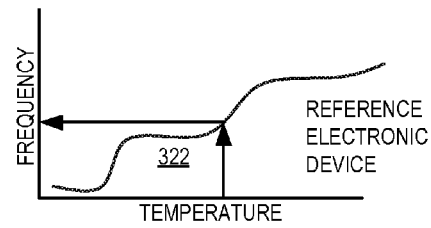
FIG. 16 is a graph showing a reference profile of frequency against temperature of one of the reference electronic devices.

FIG. 16 illustrates a reference profile 322 that is stored for one of the reference electronic devices 320. The reference profile 322 includes respective frequency provided by the reference electronic device 320 at each of a plurality of respective temperatures. The reference profile 322 corresponds to the first cab 66 having a serial number as represented by the first cab identifier 54 in FIG. 11. Each cab would have a different reference profile stored within the machine-readable medium 310 of FIG. 14 and corresponding to a different serial number. Multiple sets of electronic devices can be measured using the same reference profile of the respective cab.

Figure 17:
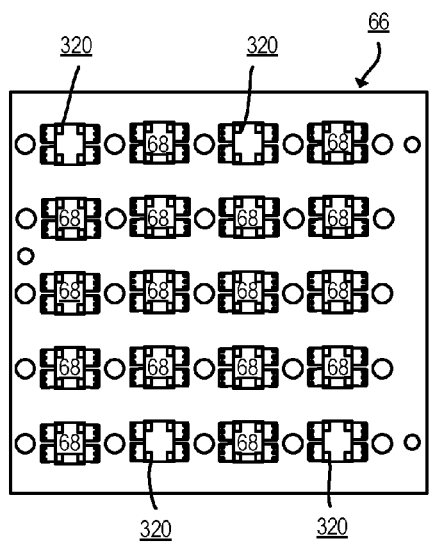
FIG. 17 is a view similar to FIG. 15 after the first set of electronic devices are placed on the first cab.

FIG. 17 shows the first cab 66 that has been loaded with the first subset of electronic devices 68. Each one of the electronic devices 68 is now a separate measured electronic device 68. When the first cab 66 with the measured electronic device 68 are inserted into the electric machine interface station 112 and are exposed to the temperatures of the first and second thermal components 116 and 118 shown in FIG. 12, the temperatures of the measured electronic devices 68 and reference electronic devices 320 change very rapidly. Because the measured electronic devices 68 and the reference electronic devices 320 are practically identical in all respects, including shape, size and materials, the measured electronic devices 68 and the reference electronic devices 320 are at all times at the same temperature while located together within the electric machine interface station 112.

Figure 18:
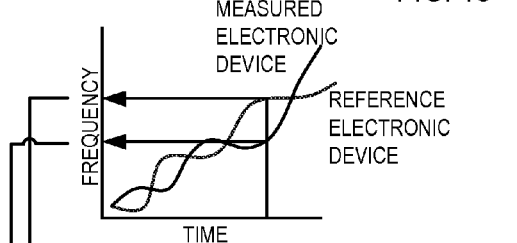
FIG. 18 is a graph illustrating frequencies that are measured at various moments of time for the reference electronic devices and the first set of electronic devices that are being measured.

FIG. 18 shows measurements that are taken over a number of moments of time from the reference and measured electronic devices 320 and 68. At one moment in time, a frequency is thus taken from both one of the reference electronic devices 320 and one of the measured electronic devices 68 as represented in the figure. The frequency provided by the reference electronic device 320 and a corresponding frequency provided by the measured electronic device 68 are recorded at each of a plurality of instances of time.

Figure 19:
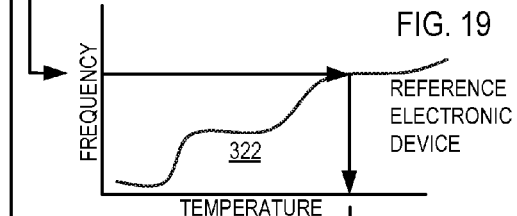
FIG. 19 is a graph showing how the frequency for the reference electronic device measured in FIG. 18 is used to determine a temperature of the reference electronic device.

As shown in FIG. 19, a determination is made of a temperature of the reference electronic device 320 based on the frequency detected for the reference electronic device 320 at the corresponding temperature within the reference profile 322. The frequency taken for the reference electronic device 320 in FIG. 18 is thus entered as the frequency in the reference profile 322 in FIG. 19 and a corresponding temperature is determined within the reference profile 322.

Figure 20:
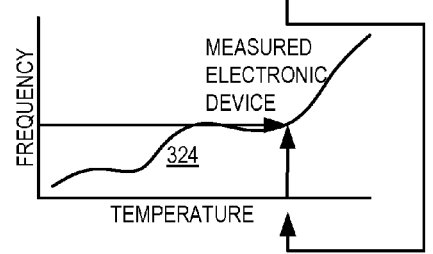
FIG. 20 is a graph showing correlation between a frequency for the measured electronic device taken from FIG. 18 with a temperature of the measured electronic device taken from FIG. 19.

Next, as shown in FIG. 20, a correlation is made between the frequency detected from the measured electronic device 68 with a temperature of the measured electronic device 68, wherein the temperature of the reference electronic device 320 is used as the temperature of the measured electronic device 68. The frequency detected in FIG. 18 for the measured electronic device 68 is thus provided as an input in FIG. 20. The temperature determined in FIG. 19 is provided as a temperature in FIG. 20. A measured profile 324 for the measured electronic device 68 is created in FIG. 20, wherein the measured profile 324 has respective frequency corresponding to each of a plurality of respective temperatures of the measured electronic device 68, each temperature being taken from the reference profile 322 in FIG. 19 of the reference electronic device 320 based on a respective frequency detected from the reference electronic device 320 in FIG. 18 within the electric machine interface station 112 in FIG. 12.

FIGS. 18 to 20 illustrate how a measured profile 324 is obtained for one of the measured electronic devices 68 shown in FIG. 17. A separate measured profile 324 is determined for each one of the measured electronic devices 68 while simultaneously being located with the reference electronic devices 320 within the electric machine interface station 112.

The measured profile 324 can be used for various purposes. One purpose is to program the respective measured electronic devices 68 based on the measured profile 324. The measured electronic device 68 may for example be programmed by the electric machine 212 in FIG. 14 while the measured electronic device 68 is located within the electric machine interface station 112 shown in FIGS. 12 and 14 and while being connected through the communication interface 30 and the electric machine interface 100 to the electric machine 212.

As mentioned with respect to FIGS. 9 and 10, one advantage is that different size electronic devices can be measured and programmed with the system 110. As mentioned with respect to FIG. 12, a more uniform temperature profile can be created through the electronic devices 68 and the first cab 66. As mentioned with respect to FIGS. 15 to 20, multiple sets of electronic devices can be measured at multiple temperatures that change rapidly, while still obtaining accurate results for purposes of programming the electronic devices 68. A further advantage is that the system 110 can be used for measuring the electronic devices 68 at different temperatures ranging from below room temperature to above room temperature without having to make any modifications other than modifying the temperature of the fluid within the temperature modification device 170 in FIG. 13.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A system for analyzing electronic devices comprising:
   a first cab including:
      a holder having formations for removably receiving a first subset of electronic devices, each electronic device having a plurality of contacts;
      a plurality of terminals within the formations, each to contact a respective one of the contacts of a respective electronic device; and
      a communications interface connected to the terminals;
   an input station configured to receive the first cab;
   a transport apparatus;
   an electric machine interface station, the transport apparatus transporting the first cab with the first subset of electronic devices from the input station to the electric machine interface station;
   an electric machine interface positioned to engage communicatively with the communications interface of the first cab when the first cab is at the electric machine interface station, the electric machine interface being disengageable from the communications interface of the first cab and the first cab being transportable by the transport apparatus away from the electric machine interface station;
   a support structure; and
   a thermal component mounted to the support structure and positioned to conduct heat to the electronic devices when the electronic devices are at the electric machine interface station.

2. The system of claim 1, wherein the holder includes:
   a support plate having a plurality of support plate securing formations;
   an interposer having a substrate, wherein the terminals of the first cab are formed on an upper surface of the substrate of the interposer, the interposer being located above the support plate;
   a printed circuit board having a substrate, a plurality of terminals on the substrate of the printed circuit board, the terminals of the printed circuit board contacting the terminals of the interposer, and a plurality of leads, each lead electrically connecting a respective one of the terminals of the printed circuit board with the communications interface, the communications interface being formed on the substrate of the printed circuit board, the printed circuit board further having a plurality of openings, wherein inside surfaces of a respective opening together with a portion of an upper surface of the interposer jointly form a respective one of the formations for removably receiving the first subset of electronic devices; and
   a plurality of fasteners that secure the printed circuit board to the support plate securing formations of the support plate with the interposer between the support plate and the printed circuit board.

3. The system of claim 2, wherein the holder further comprises a plurality of springs, each spring located between an upper surface of the support plate and a lower surface of the interposer, wherein when pressure is applied on an upper surface of the electronic devices located within the formations, the pressure is transferred through the interposer so as to compress the springs.

4. The system of claim 1, further comprising:
   a second cab including:
      a holder having formations for removably receiving a second set of electronic devices, each electronic device having a plurality of contacts;
      a plurality of terminals within the formations to contact a respective one of the contacts; and
      a communications interface connected to the terminals, wherein the input station is configured to receive the second cab, the transport apparatus transports the second cab with the second subset of electronic devices from the input station to the electric machine interface station, the electric machine interface is positioned to engage communicatively with the communications interface of the second cab when the second cab is at the electric machine interface station, the electric machine interface being disengageble from the communications interface of the second cab and the second cab being transportable by the transport apparatus away from the electric machine interface station.

5. The system of claim 4, wherein the first cab further includes a first cab identifier and the second cab has a second cab identifier that is different from the first cab identifier, further comprising:
   a cab identifier reader that reads the first and second identifiers and provides the first and second cab identifiers to an electric machine connected to the electric machine interface.

6. A method of analyzing electronic devices comprising:
   holding a first subset of electronic devices within respective formations of a first cab;
   connecting terminals within the formations with respective contacts of the electronic devices;
   transporting the first cab from an input station to an electric machine interface station;
   engaging an electric machine interface communicatively with a communications interface of the first cab while the first cab is at the electric machine interface station;
   communicating signals between an electric machine and a circuit in each one of the electronic devices of the first subset through the electric machine interface and the communications interface of the first cab;
   conducting heat between a thermal component and the electronic devices while at the electric machine interface station;
   disengaging the electric machine interface from the communications interface of the first cab; and
   transporting the first cab away from the electric machine interface station.

7. The method of claim 6, further comprising:
   holding a second subset of electronic devices within respective formations of a second cab;
   connecting terminals within the formations of the second cab with respective contacts of the electronic devices of the second set;
   transporting the second cab from the input station to the electric machine interface station;

engaging the electric machine interface communicatively with a communications interface of the second cab while the second cab is at the electric machine interface station;

communicating signals between the electric machine and a circuit in each one of the electronic devices of the second subset through the electric machine interface and the communications interface of the second cab;

disengaging the electric machine interface from the communications interface of the second cab; and transporting the second cab away from the electric machine interface station.

8. A cab comprising:

a support plate having a plurality of support plate securing formations;

an interposer having a substrate and terminals formed on an upper surface of the substrate of the interposer, the interposer being located above the support plate;

a printed circuit board having a substrate, a plurality of terminals on the substrate of the printed circuit board, the terminals of the printed circuit board contacting the terminals of the interposer, and a plurality of leads, each lead electrically connecting a respective one of the terminals of the printed circuit board with the communications interface, the communications interface being formed on the substrate of the printed circuit board, the printed circuit board further having a plurality of openings, wherein inside surfaces of a respective opening together with a portion of an upper surface of the interposer jointly form a respective one of the formations for removably receiving the first subset of electronic devices; and a plurality of fasteners that secure the printed circuit board to the support plate securing formations of the support plate with the interposer between the support plate and the printed circuit board.

9. The cab of claim 8, further comprising:

a plurality of springs, each spring located between an upper surface of the support plate and a lower surface of the interposer, wherein when pressure is applied on an upper surface of the electronic devices located within the formations, the pressure is transferred through the interposer so as to compress the springs.

* * * * *